(12) United States Patent
Park

(10) Patent No.: US 9,536,587 B2
(45) Date of Patent: Jan. 3, 2017

(54) SEMICONDUCTOR DEVICES AND INTEGRATED CIRCUITS INCLUDING THE SAME

(71) Applicant: SK hynix Inc., Icheon-si Gyeonngi-do (KR)

(72) Inventor: Sang Il Park, Suwon-si (KR)

(73) Assignee: SK HYNIX INC., Icheon-si (KR)

(*) Notice: Subject to any disclaimer, the term of this patent is extended or adjusted under 35 U.S.C. 154(b) by 0 days.

(21) Appl. No.: 15/060,984

(22) Filed: Mar. 4, 2016

(65) Prior Publication Data

US 2016/0189767 A1 Jun. 30, 2016

Related U.S. Application Data

(62) Division of application No. 14/265,493, filed on Apr. 30, 2014, now Pat. No. 9,343,136.

(30) Foreign Application Priority Data

Dec. 19, 2013 (KR) ........................ 10-2013-0159078

(51) Int. Cl.
*G11C 5/14* (2006.01)
*G11C 11/406* (2006.01)
*G11C 11/4074* (2006.01)
*G11C 11/4091* (2006.01)
*G11C 11/4094* (2006.01)
*G11C 11/4093* (2006.01)

(52) U.S. Cl.
CPC ......... *G11C 11/40615* (2013.01); *G11C 5/148* (2013.01); *G11C 11/4074* (2013.01); *G11C 11/4091* (2013.01); *G11C 11/4093* (2013.01); *G11C 11/4094* (2013.01)

(58) Field of Classification Search
None
See application file for complete search history.

(56) References Cited

U.S. PATENT DOCUMENTS

| 2002/0191467 A1* | 12/2002 | Matsumoto | G11C 11/406 365/222 |
| 2006/0215479 A1* | 9/2006 | Lee | G11C 11/4094 365/230.06 |
| 2013/0222009 A1* | 8/2013 | Kang | G11C 7/1045 326/30 |
| 2014/0369149 A1* | 12/2014 | Park | G11C 8/10 365/230.06 |

* cited by examiner

*Primary Examiner* — Khamdan Alrobaie
(74) *Attorney, Agent, or Firm* — William Park & Associates Ltd.

(57) ABSTRACT

A first semiconductor device equalizes levels of a bit line and a complementary bit line of a high-order bit line pair in a first memory block using a first drive voltage signal whose level is controlled when a power-down mode or a self-refresh mode is activated according to a level combination of high-order command/address signals. A second semiconductor device equalizes levels of a bit line and a complementary bit line of a low-order bit line pair in a second memory block using a second drive voltage signal whose level is controlled when the power-down mode or the self-refresh mode is activated according to a level combination of low-order command/address signals.

7 Claims, 5 Drawing Sheets

SEMICONDUCTOR DEVICES AND INTEGRATED CIRCUITS INCLUDING THE SAME

CROSS-REFERENCE TO RELATED APPLICATION

The present application is a Division of U.S. application Ser. No. 14/265,493, filed on Apr. 30, 2014, and the present application claims priority under 35 U.S.C 119(a) to Korean Application No. 10-2013-0159078, filed on Dec. 19, 2013, in the Korean Intellectual Property Office, which is incorporated herein by reference in its entirety as set forth in full.

BACKGROUND

1. Technical Field

Embodiments of the invention relate to semiconductor devices and integrated circuits including the same.

2. Related Art

In the electronics industry, low cost, compact and highly integrated semiconductor devices are increasingly in demand with the development of computer systems and electronic communication systems. In addition, low power semiconductor devices are increasingly in demand with the development of portable electronic products or mobile communication systems.

Each of the semiconductor devices may receive power supply voltage signal supplied from an external device or an external system to generate internal voltage signals used in operation of internal circuits thereof. For example, in case of semiconductor memory devices such as dynamic random access memory (DRAM) devices employing sense amplifiers, a core voltage signal VCORE may be used to amplify voltage levels of cell data.

SUMMARY

According to various embodiments, an integrated circuit includes a first semiconductor device and a second semiconductor device. The first semiconductor device equalizes levels of a bit line and a complementary bit line of a high-order bit line pair in a first memory block using a first drive voltage signal whose level is controlled when a power-down mode or a self-refresh mode is activated according to a level combination of high-order command/address signals. The second semiconductor device equalizes levels of a bit line and a complementary bit line of a low-order bit line pair in a second memory block using a second drive voltage signal whose level is controlled when the power-down mode or the self-refresh mode is activated according to a level combination of low-order command/address signals.

According to various embodiments, a semiconductor device includes a command/address input unit, a control signal generator and a memory block. The command/address input unit generates an idle signal, a power-down signal and a refresh signal according to a level combination of high-order command/address signals. The control signal generator generates a control signal enabled in response to the power-down signal or the refresh signal when the idle signal is enabled. The memory block generates a drive voltage signal having any one of levels of first and second high-order supply voltage signals in response to the control signal and equalizes levels of a bit line and a complementary bit line of a high-order bit line pair using the drive voltage signal.

In an embodiment, an integrated circuit includes a command/address input unit suitable for receiving command/address signals to generate an idle signal, a power-down signal, and a refresh signal. The integrated circuit may also include a power supply unit suitable for receiving a power supply voltage signal to generate a first supply voltage signal and a second supply voltage signal. In addition, the integrated circuit may include a control signal generator suitable for generating a control in response to an enablement of at least one of the idle signal, the power-down signal, and the refresh signal. Further, the integrated circuit may include a memory block suitable for equalizing levels of a bit line and a complementary bit line of a high-order bit line pair in response to a drive voltage signal generated in response to at least one of the first supply voltage signal and the second supply voltage signal.

DETAILED DESCRIPTION

Various embodiments of the invention will be described hereinafter with reference to the accompanying drawings. However, the embodiments described are for illustrative purposes only and not intended to limit the scope of the invention.

Figure 1:
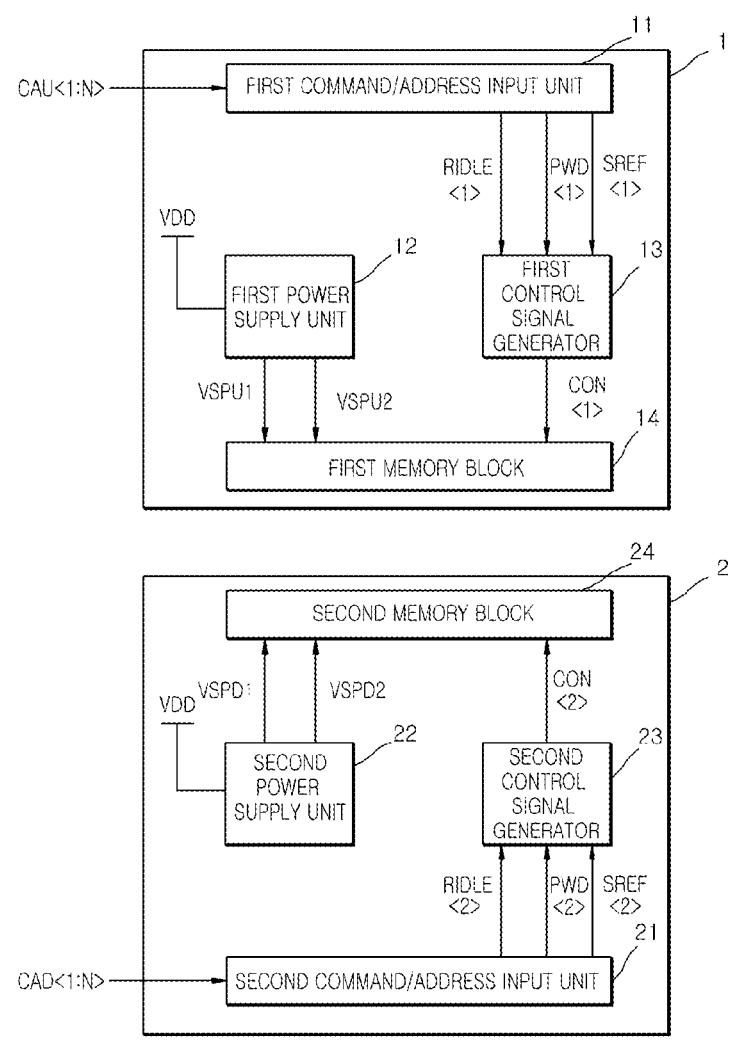
FIG. 1 is a block diagram illustrating an integrated circuit according to an embodiment of the invention.

Referring to FIG. 1, an integrated circuit according to an embodiment may include a first semiconductor device 1 and a second semiconductor device 2.

The first semiconductor device 1 may include a first command/address input unit 11, a first power supply unit 12, a first control signal generator 13 and a first memory block 14.

The first command/address input unit 11 may receive high-order command/address signals CAU<1:N> to generate a first idle signal RIDLE<1>, a first power-down signal PWD<1> and a first refresh signal SREF<1>. The first idle signal RIDLE<1> may be enabled out of an active mode according to a level combination of the high-order command/address signals CAU<1:N>. The first power-down signal PWD<1> may be enabled in a power-down mode according to a level combination of the high-order command/address signals CAU<1:N>. The first refresh signal SREF<1> may be enabled in a self-refresh mode according to a level combination of the high-order command/address signals CAU<1:N>.

The first power supply unit 12 may receive a power supply voltage signal VDD supplied from an external device to generate a first high-order supply voltage signal VSPU1 having a level of the power supply voltage signal VDD. The first power supply unit 12 may also be configured upon receipt of the power supply voltage signal VDD to generate a second high-order supply voltage signal VSPU2 having a lower level than the power supply voltage signal VDD.

The first control signal generator 13 may generate a first control signal CON<1> enabled when the first idle signal RIDLE<1> is enabled and when the first power-down signal PWD<1> or the first refresh signal SREF<1> is enabled. More specifically, the first control signal generator 13 may generate the first control signal CON<1> enabled when the power-down mode is activated after the active mode or the self-refresh mode is activated after the active mode.

Figure 3:
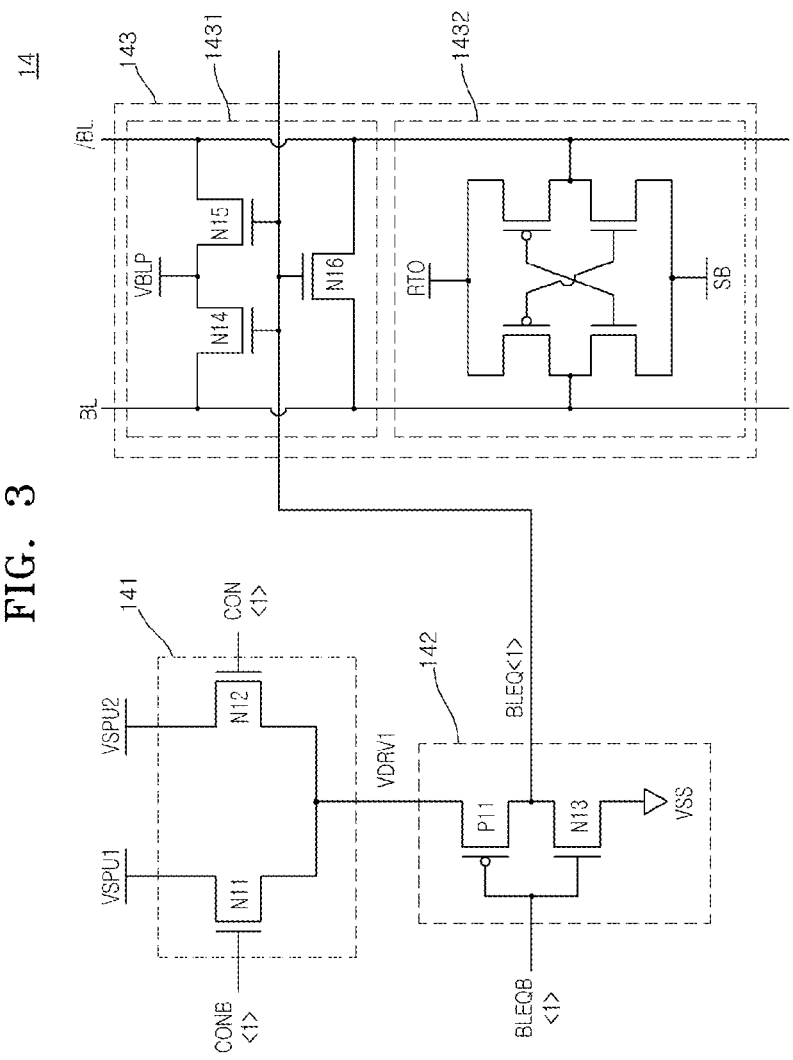
FIG. 3 is a circuit diagram illustrating a first memory block included in the integrated circuit of FIG. 1.

The first memory block 14 may equalize levels of a bit line BL and a complementary bit line /BL constituting each high-order bit line pair disposed therein using a first drive voltage signal (VDRV1 of FIG. 3). The first drive voltage signal VDRV1 may be generated from the first or second high-order supply voltage signal VSPU1 or VSPU2 when the power-down mode is activated after the active mode or the self-refresh mode is activated after the active mode.

In particular, the first semiconductor device 1 may equalize levels of a bit line BL and a complementary bit line /BL constituting each high-order bit line pair in the first memory block 14 using the first drive voltage signal VDRV1. The first drive voltage signal VDRV1 has a level controlled when the power-down mode or the self-refresh mode is activated according to a level combination of the high-order command/address signals CAU<1:N>.

The second semiconductor device 2 may include a second command/address input unit 21, a second power supply unit 22, a second control signal generator 23 and a second memory block 24.

The second command/address input unit 21 may receive low-order command/address signals CAD<1:N> to generate a second idle signal RIDLE<2>, a second power-down signal PWD<2> and a second refresh signal SREF<2>. The second idle signal RIDLE<2> may be configured to be enabled out of the active mode in response to a level combination of the low-order command/address signals CAD<1:N>. The second power-down signal PWD<2> may be enabled in the power-down mode in response to a level combination of the low-order command/address signals CAD<1:N>. The enablement of the second refresh signal SREF<2> in the self-refresh mode may be according to a level combination of the low-order command/address signals CAD<1:N>. The second command/address input unit 21 may be suitable for generating the second idle signal RIDLE<2>, the second power-down signal PWD<2> and the second refresh signal SREF<2> in response to the low-order command/address signals CAD<1:N>. As a result, the second command/address input unit 21 may have substantially the same configuration as the first command/address input unit 11.

The second power supply unit 22 may receive a power supply voltage signal VDD from an external device to generate a first low-order supply voltage signal VSPD1 having a level of the power supply voltage signal VDD. The second power supply unit 22 may also generate a second low-order supply voltage signal VSPD2 having a lower level than the power supply voltage signal VDD upon receipt of the power supply voltage signal VDD. The second power supply unit 22 may be suitable for receiving the power supply voltage signal VDD supplied from an external device to generate the first and second low-order supply voltage signals VSPD1 and VSPD2. Therefore, the second power supply unit 22 may have substantially the same configuration as the first power supply unit 12.

The second control signal generator 23 may generate a second control signal CON<2> enabled when the second idle signal RIDLE<2> is enabled and the second power-down signal PWD<2> or the second refresh signal SREF<2> is enabled. More specifically, the second control signal generator 23 may generate the second control signal CON<2> enabled when the power-down mode is activated after the active mode or the self-refresh mode is activated after the active mode. The second control signal generator 23 may be suitable for receiving the second idle signal RIDLE<2>, the second power-down signal PWD<2> and the second refresh signal SREF<2> to generate the second control signal CON<2>. Accordingly, the second control signal generator 23 may have substantially the same configuration as the first control signal generator 13.

The second memory block 24 may equalize levels of a bit line BL and a complementary bit line /BL constituting each low-order bit line pair disposed therein using a second drive voltage signal (not shown). The second drive voltage signal may be generated from the first or second low-order supply voltage signal VSPD1 or VSPD2 when the power-down mode is activated after the active mode or the self-refresh mode is activated after the active mode. The second memory block 24 may be suitable for equalizing levels of a bit line BL and a complementary bit line /BL constituting each low-order bit line pair disposed therein using a second drive voltage signal (not shown). Thus, the second memory block 24 may have substantially the same configuration as the first memory block 14.

The second semiconductor device 2 may equalize levels of a bit line BL and a complementary bit line /BL constituting each low-order bit line pair in the second memory block 24 using the second drive voltage signal (not shown). The second drive voltage signal may have a level controlled when the power-down mode or the self-refresh mode is activated according to a level combination of the low-order command/address signals CAD<1:N>.

Figure 2:
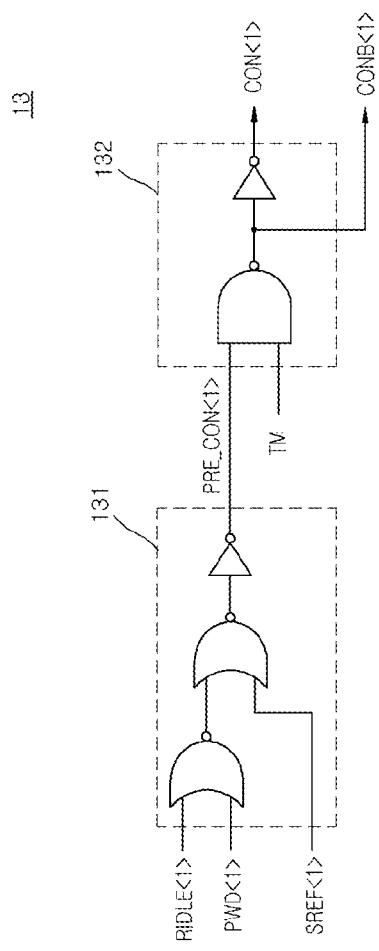
FIG. 2 is a logic circuit diagram illustrating a first control signal generator included in the integrated circuit of FIG. 1.

Referring to FIG. 2, the first control signal generator 13 of the first semiconductor device 1 may include a first logic unit 131 and a second logic unit 132.

The first logic unit 131 may generate a first pre-control signal PRE_CON<1> constituting a logic "high" level when both of the first idle signal RIDLE<1> and the first power-down signal PWD<1> are enabled to have a logic "low" level. In the alternative, the first pre-control signal PRE_CON<1> may constitute a logic "high" level when the first refresh signal SREF<1> is enabled to have a logic "high" level.

The second logic unit 132 may buffer the first pre-control signal PRE_CON<1> to generate the first control signal CON<1> and a first complementary control signal CONB<1> when a test mode signal TM is enabled to have a logic "high" level. The first complementary control signal CONB<1> may correspond to a complementary signal of the first control signal CON<1>.

Referring to FIG. 3, the first memory block 14 of the first semiconductor device 1 may include a first switch unit 141, a first buffer unit 142 and a first sense amplification unit 143.

The first switch unit 141 may include an NMOS transistor N11 turned on in response to the first complementary control signal CONB<1> to output the first high-order supply voltage signal VSPU1 as the first drive voltage signal VDRV1. The first switch unit 141 may also include a NMOS transistor N12 turned on in response to the first control signal CON<1> to output the second high-order supply voltage signal VSPU2 as the first drive voltage signal VDRV1. More specifically, the first switch unit 141 may output the first high-order supply voltage signal VSPU1 as the first drive voltage signal VDRV1 when the first control signal CON<1> is disabled to have a logic "low" level. Further, the first switch unit 141 may output the second high-order supply voltage signal VSPU2 as the first drive voltage signal VDRV1 when the first control signal CON<1> is enabled to have a logic "high" level.

The first buffer unit 142 may include a PMOS transistor P11 turned on in response to a first pre-equalization signal BLEQB<1> having a logic "low" level to drive a first equalization signal BLEQ<1> to have a level of the first drive voltage signal VDRV1. The first buffer unit 142 may also include a NMOS transistor N13 turned on in response to the first pre-equalization signal BLEQB<1> having a logic "high" level to drive the first equalization signal BLEQ<1> to have a ground voltage VSS. More specifically, the first buffer unit 142 may drive the first equalization signal BLEQ<1> to a level of the first drive voltage signal VDRV1 when the first pre-equalization signal BLEQB<1> has a logic "low" level. In addition, the first buffer unit 142 may drive the first equalization signal BLEQ<1> to a level of the ground voltage VSS when the first pre-equalization signal BLEQB<1> has a logic "high" level. The first pre-equalization signal BLEQB<1> may correspond to a signal inputted to the first buffer unit 142 to equalize levels of the bit line BL and the complementary bit line /BL that constitute each high-order bit line pair.

The first sense amplification unit 143 may include a first equalizer 1431 and a first sense amplifier 1432.

The first equalizer 1431 may include NMOS transistors N14, N15 and N16. When the first equalization signal BLEQ<1> is driven to a level of the first drive voltage signal VDRV1, the NMOS transistors N14 and N15 may be turned on to electrically couple the bit line BL and the complementary bit line /BL of the high-order bit line pair. The NMOS transistors N14 and N15 may also be turned on to supply a pre-charge voltage signal VBLP to the bit line BL and the complementary bit line /BL of the high-order bit line pair. In addition, when the first equalization signal BLEQ<1> is driven to a level of the first drive voltage signal VDRV1, the NMOS transistor N16 may also be turned on to electrically couple the bit line BL and the complementary bit line /BL of the high-order bit line pair. That is, when the first equalization signal BLEQ<1> is driven to a level of the first drive voltage signal VDRV1, the first equalizer 1431 may electrically couple the bit line BL and the complementary bit line /BL of the high-order bit line pair. Further, the first equalizer 1431 may supply the pre-charge voltage signal VBLP to the bit line BL and the complementary bit line /BL of the high-order bit line pair.

The first sense amplifier 1432 may receive a first sense amplification bias voltage signal RTO and a second sense amplification bias voltage signal SB to detect and amplify a voltage difference between the bit line BL and the complementary bit line /BL of the high-order bit line pair. The first sense amplification bias voltage signal RTO may have a level of a core voltage signal VCORE obtained by lowering a level of the power supply voltage signal VDD. In addition, the second sense amplification bias voltage signal SB may have a level of the ground voltage signal VSS.

Although FIG. 3 illustrates an example in which the first memory block 14 includes a single first switch unit 141, a single first buffer unit 142 and a single first sense amplification unit 143, the inventive concept is not limited thereto. For instance, in various embodiments, the first memory block 14 may be suitable for including a plurality of first switch unit 141, a plurality of first buffer unit 142 and a plurality of first sense amplification unit 143 electrically coupled to a plurality of memory cells.

Figure 4:
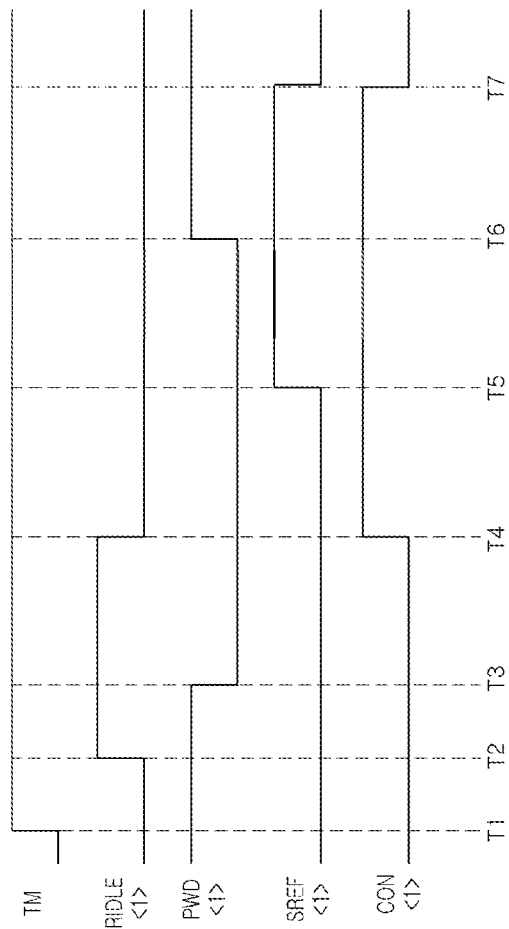
FIG. 4 is a timing diagram illustrating an operation of a first semiconductor device included in the integrated circuit of FIG. 1.

An operation of the integrated circuit having the aforementioned configuration will be described with reference to FIG. 4 in conjunction with an example. Moreover, in the example, levels of the bit line BL and the complementary bit line /BL of the high-order bit line pair are equalized in the event that the active mode, the power-down mode and the self-refresh mode are sequentially activated.

At a point of time "T1" that the integrated circuit is out of the active mode, the first command/address input unit 11 of the first semiconductor device 1 may generate the first idle signal RIDLE<1> having a logic "low" level. The first semiconductor device 1 may also generate the first power-down signal PWD<1> having a logic "high" level. In addition, the first semiconductor device 1 may also generate the first refresh signal SREF<1> having a logic "low" level according to a level combination of the high-order command/address signals CAU<1:N>.

The first power supply unit 12 may receive the power supply voltage signal VDD from an external device to generate the first high-order supply voltage signal VSPU1 having a level of the power supply voltage signal VDD. The first power supply unit 12 may then also generate the second high-order supply voltage signal VSPU2 having a lower level than the power supply voltage signal VDD.

The first control signal generator 13 may receive the test mode signal TM having a logic "high" level. The first control signal generator 13 may also receive the first idle signal RIDLE<1> having a logic "low" level. Further, the first control signal generator 13 may receive the first power-down signal PWD<1> having a logic "high" level. In addition, the first control signal generator 13 may receive the first refresh signal SREF<1> having a logic "low" level to generate the first control signal CON<1> having a logic "low" level.

The first switch unit 141 of the first memory block 14 may receive the first control signal CON<1> having a logic "low" level to output the first high-order supply voltage signal VSPU1 having a level of the power supply voltage signal VDD as the first drive voltage signal VDRV1. The first buffer unit 142 may receive the first pre-equalization signal BLEQB<1> having a logic "low" level to drive the first equalization signal BLEQ<1> to a level of the first drive voltage signal VDRV1. The NMOS transistors N14, N15 and N16 constituting the first equalizer 1431 of the first sense amplification unit 143 may be turned on in response to the first equalization signal BLEQ<1> to equalize levels of the bit line BL and the complementary bit line /BL of the high-order bit line pair. The first equalization signal BLEQ<1> may have a level of the first drive voltage signal VDRV1. In such a situation, the first equalization signal BLEQ<1> with a level of the power supply voltage signal VDD may be applied to gates of the NMOS transistors N14, N15 and N16.

At time "T2" wherein the active mode is activated, the first command/address input unit 11 of the first semiconductor device 1 may generate the first idle signal RIDLE<1> having a logic "high" level. Further the first semiconductor device 1 may generate the first power-down signal PWD<1> having a logic "high" level. In addition, the first semiconductor device 1 may generate the first refresh signal SREF<1> having a logic "low" level according to a level combination of the high-order command/address signals CAU<1:N>.

The first power supply unit 12 may receive the power supply voltage signal VDD from an external device to generate the first high-order supply voltage signal VSPU1 having a level of the power supply voltage signal VDD. In addition, the first power supply unit 12 may then generate the second high-order supply voltage signal VSPU2 having a lower level than the power supply voltage signal VDD.

The first control signal generator 13 may receive the test mode signal TM having a logic "high" level. The first control signal generator 13 may also receive the first idle signal RIDLE<1> having a logic "high" level. Further, the first control signal generator 13 may receive the first power-down signal PWD<1> having a logic "high" level. Moreover, the first control signal generator 13 may also receive the first refresh signal SREF<1> having a logic "low" level to generate the first control signal CON<1> having a logic "low" level.

The first switch unit 141 of the first memory block 14 may receive the first control signal CON<1> having a logic "low" level to output the first high-order supply voltage signal VSPU1 having a level of the power supply voltage signal VDD as the first drive voltage signal VDRV1. The first buffer unit 142 may receive the first pre-equalization signal BLEQB<1> having a logic "low" level to drive the first equalization signal BLEQ<1> to a level of the first drive voltage signal VDRV1. The NMOS transistors N14, N15 and N16 that constitute the first equalizer 1431 of the first sense amplification unit 143 may be turned on in response to the first equalization signal BLEQ<1>. The first equalization signal BLEQ<1> may have a level of the first drive voltage signal VDRV1. The NMOS transistors N14, N15 and N16 may be turned on to equalize levels of the bit line BL and the complementary bit line /BL of the high-order bit line pair. In such a case, the first equalization signal BLEQ<1> having a level of the power supply voltage signal VDD may then be applied to gates of the NMOS transistors N14, N15 and N16.

At time "T3" the power-down mode is activated in the active mode, the first command/address input unit 11 of the first semiconductor device 1 may generate the first idle signal RIDLE<1> having a logic "high" level. Further, the first command/address input unit 11 may generate the first power-down signal PWD<1> having a logic "low" level. In addition, the first command/address input unit 11 may also generate the first refresh signal SREF<1> having a logic "low" level according to a level combination of the high-order command/address signals CAU<1:N>.

The first power supply unit 12 may receive the power supply voltage signal VDD from an external device to generate the first high-order supply voltage signal VSPU1 having a level of the power supply voltage signal VDD. The first power supply unit 12 may also generate the second high-order supply voltage signal VSPU2 having a lower level than the power supply voltage signal VDD upon receipt of the power supply voltage signal VDD.

The first control signal generator 13 may receive the test mode signal TM having a logic "high" level. The first control signal generator 13 may also receive the first idle signal RIDLE<1> having a logic "high" level. In addition, the first control signal generator 13 may also receive the first power-down signal PWD<1> having a logic "low" level. In addition, the first control signal generator 13 may receive the first refresh signal SREF<1> having a logic "low" level to generate the first control signal CON<1> having a logic "low" level.

The first switch unit 141 of the first memory block 14 may receive the first control signal CON<1> with a logic "low" level to output the first high-order supply voltage signal VSPU1 with a level of the power supply voltage signal VDD as the first drive voltage signal VDRV1. The first buffer unit 142 may be suitable for receiving the first pre-equalization signal BLEQB<1> having a logic "low" level to drive the first equalization signal BLEQ<1> to a level of the first drive voltage signal VDRV1. The NMOS transistors N14, N15 and N16 that constitute the first equalizer 1431 of the first sense amplification unit 143 may be turned on in response to the first equalization signal BLEQ<1>. The first equalization signal BLEQ<1> may have a level of the first drive voltage signal VDRV1. Moreover, the NMOS transistors N14, N15 and N16 may be turned on to equalize levels of the bit line BL and the complementary bit line /BL of the high-order bit line pair. In such an instance, the first equalization signal BLEQ<1> having a level of the power supply voltage signal VDD may be applied to gates of the NMOS transistors N14, N15 and N16.

At time "T4" the power-down mode is still activated after termination of the active mode, the first command/address input unit 11 of the first semiconductor device 1 may generate the first idle signal RIDLE<1> having a logic "low" level. The first command/address input 11 may also generate the first power-down signal PWD<1> having a logic "low" level. In addition, the first command/address input 11 may also generate the first refresh signal SREF<1> having a logic "low" level according to a level combination of the high-order command/address signals CAU<1:N>.

The first power supply unit 12 may receive the power supply voltage signal VDD from an external device to generate the first high-order supply voltage signal VSPU1 having a level of the power supply voltage signal VDD. Upon receipt of the power supply voltage signal VDD, the first power supply unit 12 may also generate the second high-order supply voltage signal VSPU2 having a lower level than the power supply voltage signal VDD.

The first control signal generator 13 may receive the test mode signal TM having a logic "high" level. The first control signal generator 13 may also be suitable for receiving the first idle signal RIDLE<1> having a logic "low" level. In addition, the first control signal generator 13 may be suitable for receiving the first power-down signal PWD<1> having a logic "low" level. Further, the first control signal generator 13 may be suitable for receiving the first refresh signal SREF<1> having a logic "low" level to generate the first control signal CON<1> having a logic "high" level.

The first switch unit 141 of the first memory block 14 may receive the first control signal CON<1> having a logic "high" level to output the second high-order supply voltage signal VSPU2 having a lower level than the power supply voltage signal VDD as the first drive voltage signal VDRV1. The first buffer unit 142 may receive the first pre-equalization signal BLEQB<1> having a logic "low" level to drive the first equalization signal BLEQ<1> to a level of the first drive voltage signal VDRV1. The NMOS transistors N14, N15 and N16 constituting the first equalizer 1431 of the first sense amplification unit 143 may be turned on in response to the first equalization signal BLEQ<1>. Moreover, the first equalization signal BLEQ<1> may have a level of the first drive voltage signal VDRV1. The first NMOS transistor N14 to N16 may be turned on to equalize levels of the bit line BL and the complementary bit line /BL of the high-order bit line pair. In such a case, the first equalization signal BLEQ<1> having a lower level than the power supply voltage signal VDD may be applied to gates of the NMOS transistors N14, N15 and N16.

In the case where the power-down mode is activated after termination of the active mode, a level of the first equalization signal BLEQ<1> applied to the gates of the NMOS transistors N14, N15 and N16 may be changed. Moreover, the level of the first equalization signal BLEQ<1> may be changed from a level of the power supply voltage signal VDD (applied in the active mode) into a level which is lower than a level of the power supply voltage signal VDD. Accordingly, leakage currents of the NMOS transistors N14, N15 and N16 may be reduced. That is, when the power-down mode is activated after termination of the active mode, a level of the first equalization signal BLEQ<1> applied to the gates of the NMOS transistors N14, N15 and N16 may be lowered. Further, the level of the first equalization signal BLEQ<1> may be lowered to reduce a voltage difference between the gate and bulk region (channel body region) of each of the NMOS transistors N14, N15 and N16. As a result, the leakage currents of the NMOS transistors N14, N15 and N16 may be reduced.

At time "T5" the self-refresh mode is activated in the power-down mode, the first command/address input unit 11 of the first semiconductor device 1 may generate the first idle signal RIDLE<1> having a logic "low" level. The first command/address input 11 may also generate the first power-down signal PWD<1> having a logic "low" level. In addition, the first command/address input 11 may generate the first refresh signal SREF<1> having a logic "high" level according to a level combination of the high-order command/address signals CAU<1:N>.

The first power supply unit 12 may be suitable for receiving the power supply voltage signal VDD from an external device to generate the first high-order supply voltage signal VSPU1 having a level of the power supply voltage signal VDD. The first power supply unit 12 may then also generate the second high-order supply voltage signal VSPU2 having a lower level than the power supply voltage signal VDD.

The first control signal generator 13 may be suitable for receiving the test mode signal TM having a logic "high" level. The first control signal generator 13 may also receive the first idle signal RIDLE<1> having a logic "low" level. In addition, the first control signal generator 13 may be suitable for receiving the first power-down signal PWD<1> having a logic "low" level. Further, the first control signal generator 13 may receive the first refresh signal SREF<1> having a logic "high" level to generate the first control signal CON<1> having a logic "high" level.

The first switch unit 141 of the first memory block 14 may receive the first control signal CON<1> having a logic "high" level to output the second high-order supply voltage signal VSPU2 having a lower level than the power supply voltage signal VDD as the first drive voltage signal VDRV1. The first buffer unit 142 may receive the first pre-equalization signal BLEQB<1> having a logic "low" level to drive the first equalization signal BLEQ<1> to a level of the first drive voltage signal VDRV1. The NMOS transistors N14, N15 and N16 constituting the first equalizer 1431 of the first sense amplification unit 143 may be turned on in response to the first equalization signal BLEQ<1>. The first equalization signal BLEQ<1> may have a level of the first drive voltage signal VDRV1. The NMOS transistors N14 to N16 may be turned on to equalize levels of the bit line BL and the complementary bit line /BL of the high-order bit line pair. In such a configuration, the first equalization signal BLEQ<1> having a lower level than the power supply voltage signal VDD may be applied to gates of the NMOS transistors N14, N15 and N16.

At time "T6" the self-refresh mode is still activated after termination of the power-down mode, the first command/address input unit 11 of the first semiconductor device 1 may generate the first idle signal RIDLE<1> having a logic "low" level. The first command/address input unit 11 may also generate the first power-down signal PWD<1> having a logic "high" level. Further, the first command/address input unit 11 may generate the first refresh signal SREF<1> having a logic "high" level according to a level combination of the high-order command/address signals CAU<1:N>.

The first power supply unit 12 may receive the power supply voltage signal VDD from an external device to generate the first high-order supply voltage signal VSPU1 having a level of the power supply voltage signal VDD. Further, upon receipt of the power supply voltage signal VDD, the first power supply unit 12 may generate the second high-order supply voltage signal VSPU2 having a lower level than the power supply voltage signal VDD.

The first control signal generator 13 may receive the test mode signal TM having a logic "high" level. The first control signal generator 13 may receive the first idle signal RIDLE<1> having a logic "low" level. The first control signal generator 13 may also receive the first power-down signal PWD<1> having a logic "high" level. Further, the first control signal generator 13 may receive the first refresh signal SREF<1> having a logic "high" level to generate the first control signal CON<1> having a logic "high" level.

The first switch unit 141 of the first memory block 14 may receive the first control signal CON<1> having a logic "high" level to output the second high-order supply voltage signal VSPU2 having a lower level than the power supply voltage signal VDD as the first drive voltage signal VDRV1. The first buffer unit 142 may receive the first pre-equalization signal BLEQB<1> having a logic "low" level to drive the first equalization signal BLEQ<1> to a level of the first drive voltage signal VDRV1. The NMOS transistors N14, N15 and N16 constituting the first equalizer 1431 of the first sense amplification unit 143 may be turned on in response to the first equalization signal BLEQ<1>. The first equalization signal BLEQK<1> may have a level of the first drive voltage signal VDRV1. The NMOS transistors N14, N15 and 16 may be turned on to equalize levels of the bit line BL and the complementary bit line /BL of the high-order bit line pair. In such a configuration, the first equalization signal BLEQ<1> having a lower level than the power supply voltage signal VDD may be applied to gates of the NMOS transistors N14, N15 and N16.

More specifically, when the self-refresh mode is activated after termination of the active mode, a level of the first equalization signal BLEQ<1> applied to the gates of the NMOS transistors N14, N15 and N16 may be changed. The level of the first equalization signal BLEQ<1> may be changed from a level of the power supply voltage signal VDD (applied in the active mode) into a level lower than a level of the power supply voltage signal VDD. Thus, leakage currents of the NMOS transistors N14, N15 and N16 may be reduced. When the self-refresh mode is activated after termination of the active mode, a level of the first equalization signal BLEQ<1> applied to the gates of the NMOS transistors N14, N15 and N16 may be lowered. Moreover, the level of the first equalization signal BLEQ<1> may be lowered to reduce a voltage difference between the gate and bulk region (channel body region) of each of the NMOS transistors N14, N15 and N16. As a result, the leakage currents of the NMOS transistors N14, N15 and N16 may be reduced.

At time "T7" the self-refresh mode terminates, the first command/address input unit 11 of the first semiconductor device 1 may generate the first idle signal RIDLE<1> having a logic "low" level. The first command/address input unit 11 may also generate the first power-down signal PWD<1> having a logic "high" level. In addition, the first command/address input unit 11 may generate the first refresh signal SREF<1> having a logic "low" level according to a level combination of the high-order command/address signals CAU<1:N>.

The first power supply unit 12 may receive the power supply voltage signal VDD from an external device to generate the first high-order supply voltage signal VSPU1 having a level of the power supply voltage signal VDD. Upon receipt of the power supply voltage signal VDD, the first power supply 12 may also generate the second high-order supply voltage signal VSPU2 having a lower level than the power supply voltage signal VDD.

The first control signal generator 13 may receive the test mode signal TM having a logic "high" level. The first control signal generator 13 may receive the first idle signal RIDLE<1> having a logic "low" level. In addition, the first control signal generator 13 may receive the first power-down signal PWD<1> having a logic "high" level. Further, the first control signal generator 13 may receive the first refresh signal SREF<1> having a logic "low" level to generate the first control signal CON<1> having a logic "low" level.

The first switch unit 141 of the first memory block 14 may receive the first control signal CON<1> having a logic "low" level to output the first high-order supply voltage signal VSPU1 having a lower level than the power supply voltage signal VDD as the first drive voltage signal VDRV1. The first buffer unit 142 may receive the first pre-equalization signal BLEQB<1> having a logic "low" level to drive the first equalization signal BLEQ<1> to a level of the first drive voltage signal VDRV1. The NMOS transistors N14, N15 and N16 constituting the first equalizer 1431 of the first sense amplification unit 143 may be turned on in response to the first equalization signal BLEQ<1>. The first equalization signal BLEQ<1> may have a level of the first drive voltage signal VDRV1. In addition, the NMOS transistors may be turned on to equalize levels of the bit line BL and the complementary bit line /BL of the high-order bit line pair. In such a case, the first equalization signal BLEQ<1> having a level of the power supply voltage signal VDD may be applied to gates of the NMOS transistors N14, N15 and N16.

Figure 5:
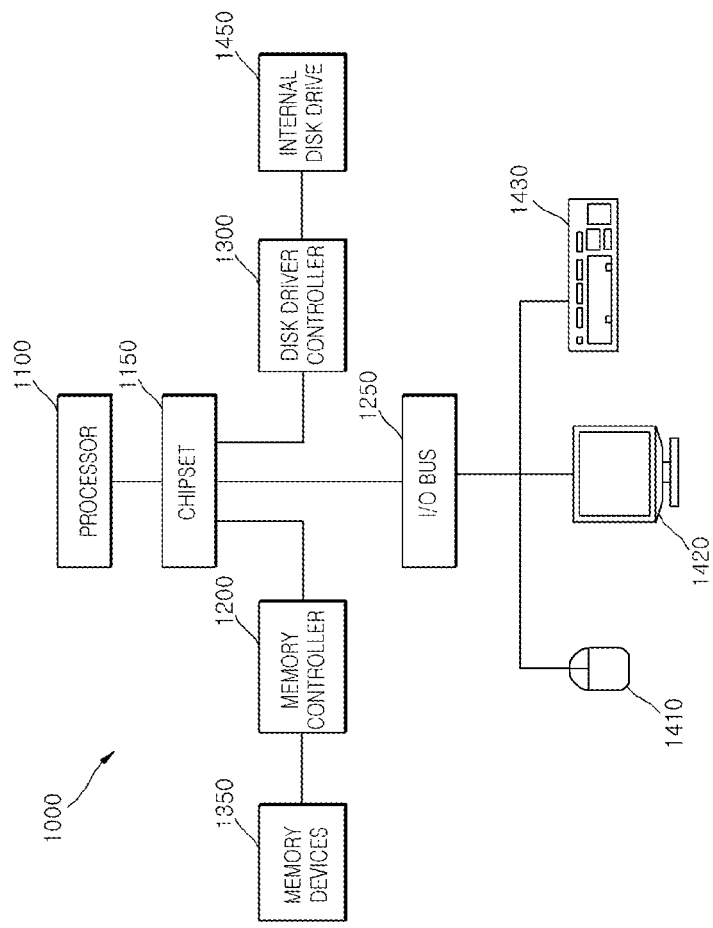
FIG. 5 illustrates a block diagram of a system employing a memory controller circuit in accordance with an embodiment of the invention.

Referring to FIG. 5, a system 1000 may include one or more processors 1100. The processor 1100 may be used individually or in combination with other processors. A chipset 1150 may be electrically coupled to the processor. The chipset 1150 may be a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 may be electrically coupled to one or more memory devices 1350. The memory devices 1350 may include the first semiconductor device 1 and the second semiconductor device 2 described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset 1150 and one or more internal disk drives 1450. Further, the disk drive controller 1300 and the internal disk drives 1450 may communicate with each other or with the chipset 1150 using virtually any type of communication protocol.

As described above, an integrated circuit having according to the embodiments may lower a voltage level of an equalization signal applied to gates of transistors for equalizing a bit line pair in a power-down mode or a self-refresh mode after termination of an active mode. As a result, leakage currents of the transistors may be reduced to decrease power consumption of the integrated circuit.

What is claimed is:

1. A semiconductor device comprising:
   a command/address input circuit suitable for generating an idle signal, a power-down signal and a refresh signal according to a level combination of high-order command/address signals;
   a control signal generator circuit suitable for generating a control signal enabled in response to the power-down signal or the refresh signal when the idle signal is enabled; and
   a memory block circuit suitable for generating a drive voltage signal having any one of levels of first and second high-order supply voltage signals in response to the control signal and suitable for equalizing levels of a bit line and a complementary bit line of a high-order bit line pair using the drive voltage signal.

2. The semiconductor device of claim 1,
   wherein the idle signal is enabled out of an active mode;
   wherein the power-down signal is enabled in a power-down mode; and
   wherein the refresh signal is enabled in a self-refresh mode.

3. The semiconductor device of claim 1,
   wherein the drive voltage signal has a level lower than a level of a power supply voltage signal when a power-down mode or a self-refresh mode is activated; and
   wherein the drive voltage signal has a level of the power supply voltage signal when the power-down mode and the self-refresh mode are not activated.

4. The semiconductor device of claim 1, further comprising:
   a power supply unit suitable for generating a first high-order supply voltage signal having a level of a power supply voltage signal and a second high-order supply voltage signal having a lower level than the power supply voltage signal.

5. The semiconductor device of claim 1, wherein the control signal generator circuit includes:
   a first logic unit suitable for generating a pre-control signal enabled when the power-down signal or the refresh signal is enabled in response to the idle signal; and
   a second logic unit suitable for buffering the pre-control signal in response to a test mode signal to generate the control signal.

6. The semiconductor device of claim 1, wherein the memory block circuit includes:
   a switch unit suitable for outputting the first high-order supply voltage signal as the drive voltage signal when the control signal is disabled and suitable for outputting the second high-order supply voltage signal as the drive voltage signal when control signal is enabled;

a buffer unit suitable for being driven by the drive voltage signal and suitable for buffering a pre-equalization signal to generate an equalization signal; and a sense amplification unit suitable for detecting and amplifying a voltage difference between the bit line and the complementary bit line of the high-order bit line pair and suitable for equalizing levels of the bit line and the complementary bit line of the high-order bit line pair when the equalization signal is driven to have a level of the drive voltage signal.

7. The semiconductor device of claim 6, wherein the sense amplification unit includes:

a equalizer suitable for electrically connecting the bit line and the complementary bit line of the high-order bit line pair in response to the equalization signal to equalize the high-order bit line pair; and a sense amplifier suitable for detecting and amplify a voltage difference between the bit line and the complementary bit line of the high-order bit line pair in an active mode.

\* \* \* \* \*